US006953987B2

(12) United States Patent
Numazaki et al.

(10) Patent No.: US 6,953,987 B2
(45) Date of Patent: Oct. 11, 2005

(54) COMPOSITE INTEGRATED CIRCUIT DEVICE HAVING RESTRICTED HEAT CONDUCTION

(75) Inventors: Koji Numazaki, Nukata-gun (JP); Mitsuhiro Saitou, Obu (JP)

(73) Assignee: Denso Corporation, Kariya (JP)

( * ) Notice: Subject to any disclaimer, the term of this patent is extended or adjusted under 35 U.S.C. 154(b) by 5 days.

(21) Appl. No.: 10/625,613

(22) Filed: Jul. 24, 2003

(65) Prior Publication Data

US 2004/0145038 A1 Jul. 29, 2004

(30) Foreign Application Priority Data

Jul. 31, 2002 (JP) .......................................... 2002-223639

(51) Int. Cl.[7] .......................... H01L 23/34; H01L 23/495
(52) U.S. Cl. ........................ 257/666; 257/774; 257/773; 257/676; 257/691; 257/693; 257/678; 257/687; 257/680; 257/698; 257/723; 257/685; 257/728; 257/724; 257/668; 361/760; 361/783; 361/776; 361/728; 174/260; 174/255
(58) Field of Search ................................. 257/666, 668, 257/774, 773, 676, 691, 693, 678, 687, 680, 698, 723, 685, 728, 724; 361/760, 783, 776, 728; 174/260, 255

(56) References Cited

U.S. PATENT DOCUMENTS

| 4,195,193 | A | * | 3/1980 | Grabbe et al. | ............. | 174/52.4 |
|---|---|---|---|---|---|---|
| 5,264,730 | A | * | 11/1993 | Matsuzaki et al. | .......... | 257/787 |
| 5,305,179 | A | * | 4/1994 | Sono et al. | .................. | 361/718 |
| 5,397,915 | A | | 3/1995 | Nose | | |
| 5,426,405 | A | * | 6/1995 | Miller et al. | ................. | 333/247 |
| 5,492,842 | A | * | 2/1996 | Eytcheson et al. | ............ | 438/15 |
| 5,859,471 | A | * | 1/1999 | Kuraishi et al. | ............. | 257/666 |
| 6,259,157 | B1 | * | 7/2001 | Sakamoto et al. | .......... | 257/723 |
| 6,484,708 | B2 | * | 11/2002 | Hirakawa et al. | ........... | 123/647 |
| 6,579,623 | B2 | * | 6/2003 | Kurihara et al. | ............. | 428/556 |
| 6,624,511 | B2 | * | 9/2003 | Sakamoto et al. | .......... | 257/734 |
| 6,630,748 | B2 | * | 10/2003 | Sato et al. | ................. | 307/10.1 |
| 2004/0007384 | A1 | * | 1/2004 | Soga et al. | .................. | 174/260 |

FOREIGN PATENT DOCUMENTS

| JP | 6-45476 | * | 2/1994 | ................. | 257/787 |
|---|---|---|---|---|---|
| JP | 6-140274 | * | 5/1994 | | |
| JP | A-7-66355 | | 3/1995 | | |
| JP | A-9-293802 | | 11/1997 | | |
| JP | A-2001-77270 | | 3/2001 | | |
| JP | 2003-51578 | * | 2/2003 | | |

* cited by examiner

*Primary Examiner*—Alexander Oscar Williams
(74) *Attorney, Agent, or Firm*—Posz Law Group, PLC

(57) ABSTRACT

A composite integrated circuit is formed by being molded with a mold resin, including a seat member of a lead frame, a substrate attached on the seat member of the lead frame, a heater element, and a temperature-restricted element. Here, the heater element and the temperature-restricted element are mounted on the substrate. The seat member of the lead frame includes a hollow member that is located under an intermediate area between the heater element and the temperature-restricted element.

15 Claims, 7 Drawing Sheets

COMPOSITE INTEGRATED CIRCUIT DEVICE HAVING RESTRICTED HEAT CONDUCTION

CROSS REFERENCE TO RELATED APPLICATIONS

This application is based on and incorporates herein by reference Japanese Patent Application No. 2002-223639 filed on Jul. 31, 2002.

FIELD OF THE INVENTION

The present invention relates to a composite integrated circuit (IC) device that is molded with a mold resin, including a lead frame and a substrate attached on a seat member of the lead frame. Here, a heater element and a temperature-restricted element are mounted on the substrate. Heat conduction from the heater element to the temperature-restricted element can be restricted by a hollow member provided in the seat member of the lead frame.

BACKGROUND OF THE INVENTION

Elements mounted on a substrate of a composite integrated circuit (IC) device include a heater element, such as a resistor, which heats under a load of high electric current, and a temperature-restricted element, such as a semiconductor, which has restriction on operating temperature. Heat generated from the heater element adversely affects the temperature-restricted element. Therefore, in a composite IC device, a dissipating member is attached to the temperature-restricted element for enhancing heat dissipation, or the heat element and temperature-restricted element are respectively mounted on separated substrates.

Recent downsizing requirement causes a composite IC device to include a heater element and a temperature-restricted element on its single substrate. For instance, for downsizing an electronic control unit (ECU) as a vehicular composite IC device, a circuit driving a motor or lamps is included in the single circuit of the ECU. FIGS. 9A to 9C show an instance of an ECU of this vehicular composite IC device 100 whose substrate includes a lamp driving circuit. FIG. 9A shows a schematic diagram of an electric circuit. FIG. 9B shows a top view of the composite IC device 100, while FIG. 9C shows a sectional view taken along line 9C—9C.

A lamp driving circuit within the ECU 100 is surrounded by a dashed line in FIG. 9B and constructed of a power transistor 51 and a resistor 41. Within the ECU 100, a control circuit (not shown) including a logic IC or memory IC is contained. The lamp 91 is connected with a battery 92 outside the ECU 100 and also with the power transistor 51 via the resistor 41. An electric current flowing through the power transistor 51 is controlled by a signal from the control circuit for driving the lamp 91.

The power transistor 51 and the resistor 41, both of which a large electric current flows through, heat up during the operating, so that they are categorized as heater elements. A typical permissible temperature of the resistor 41 is 300 to 500° C. and has a margin against an operating temperature. The resistor 41 is thereby not categorized as a temperature-resisted element. By contrast, the power transistor 51 of a semiconductor has a permissible temperature of less than 150° C. to be thereby categorized as a temperature-restricted element. Furthermore, a semiconductor of a logic IC or memory IC is categorized not as a heater element, but as a temperature-restricted element.

In the composite IC device 100 shown in FIG. 9B, the resistor 41 as a representative of a heater element and the power transistor 51 as a representative of a temperature-restricted element are mounted on a single alumina ($Al_2O_3$) substrate 3. The lamp driving circuit shown in FIG. 9A is thus formed on the single alumina substrate 3.

The alumina substrate 3 having the heat element 41 and the temperature-restricted element 51 is attached, with an adhesive, on a seat member 2a of a lead frame 2 made of copper. Each pad 30 formed on the alumina substrate 3 and each lead pin 2b of the lead frame 2 are connected with each other by a bonding wire 6. Entire structure including the alumina substrate 3, the seat member 2a, and the wires 6 is molded and sealed with a mold resin 1 along with lead pins 2b being projecting, as shown in dashed lines of FIGS. 9B, 9C.

In this structure, heat generated from the heat element 41 is conducted to heat the temperature-restricted element 51, so that the temperature-restricted element 51 is apt to incur an operational defect. Consequently, as a countermeasure, applied voltage is restricted to suppress heat generation of the heater element 41, so that heat is inhibited from being conducted to the temperature-restricted element 51. However, since the applied voltage is restricted, electric current cannot be sufficiently supplied to the heater element 41.

As another countermeasure, the alumina substrate 3 is enlarged for dissipating heat so that heat conduction to the temperature-restricted element 51 can be suppressed. However, this countermeasure is against requirement of downsizing and the composite IC device 100 undesirably becomes larger. Furthermore, dissipating fins can be provided on the alumina substrate 3 to enhance dissipation ability and suppress heat from being conducted to the temperature-restricted element 51. However, this results in increasing manufacturing cost of the composite IC device 100.

SUMMARY OF THE INVENTION

It is an object of the present invention to provide a composite IC device that acquires sufficient permissible electric current along with being compact and low-cost.

To achieve the above object, a composite integrated circuit device is provided with the following. The composite integrated circuit device includes a lead frame and a substrate where a heat element and a temperature-restricted element are mounted. The substrate is attached with an adhesive over a top surface of a seat member of the lead frame. The lead frame and the substrate are molded with a mold resin. The seat member of the lead frame includes a hollow member. The hollow member is formed in such a region that corresponds to apportion of an intermediate area that is located between the heater element and the temperature-restricted element. This structure can restrict heat conduction from the heater element to the temperature-restricted element. This enables the composite integrated circuit device to have a sufficient permissible electric current with being compact and low-cost.

BRIEF DESCRIPTION OF THE DRAWINGS

The above and other objects, features, and advantages of the present invention will become more apparent from the following detailed description made with reference to the accompanying drawings. In the drawings.

Figure 1A:
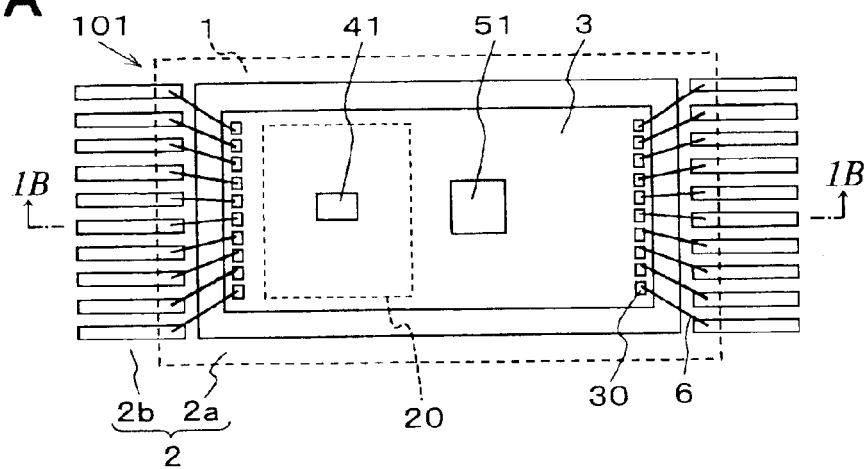
FIG. 1A is a schematic top view of a composite IC device according to a first embodiment of the present invention.
Figure 1B:
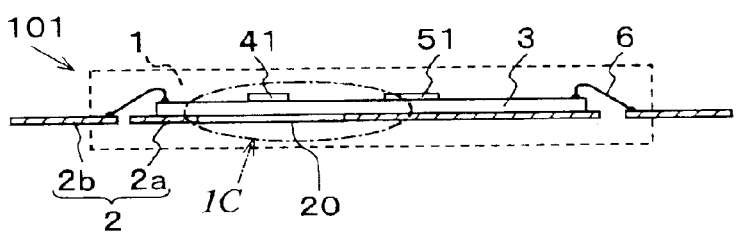
FIG. 1B is a sectional view taken along line 1B—1B of FIG. 1.
Figure 1C:
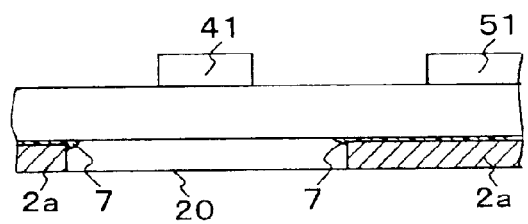
FIG. 1C is an enlarged view of an encircled portion 1C of FIG. 1B.
Figure 1D:
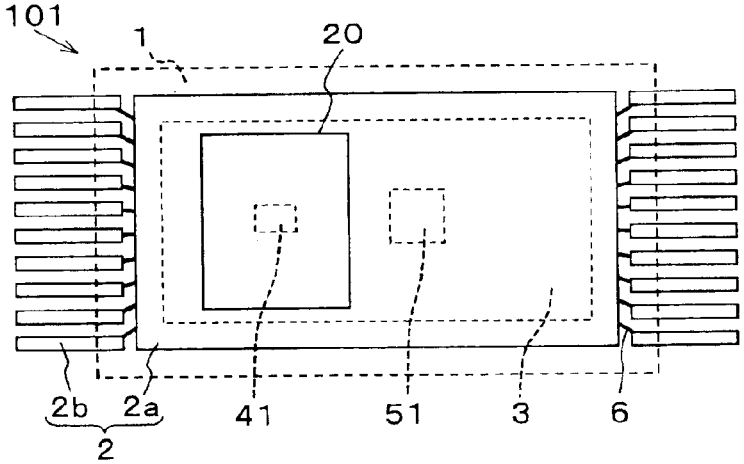
FIG. 1D is a schematic bottom view of the composite IC device according to the first embodiment.

DETAILED DESCRIPTION OF THE PREFERRED EMBODIMENTS (First Embodiment)

A composite integrated circuit (IC) device 101 as an embodiment of the present invention is shown in FIGS. 1A to 1D. The composite IC device 101 has a resistor 41 as an instance of a heater element and a power transistor 51 as an instance of a temperature-restricted element on an alumina substrate 3. The alumina substrate 3 is attached with an adhesive 7 on a seat member 2a of a lead frame 2. The alumina substrate 3 including the heater element 41 and the temperature-restricted element 51, and the seat member 2a are entirely molded with a mold resin 1 to be sealed.

Figure 9A:
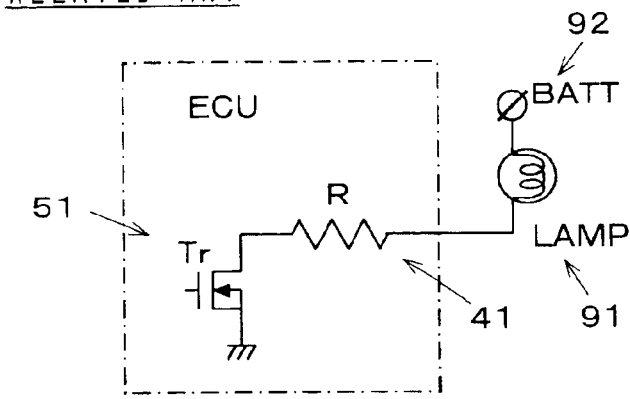
FIG. 9A is a schematic electric circuit diagram of a related art.
Figure 9B:
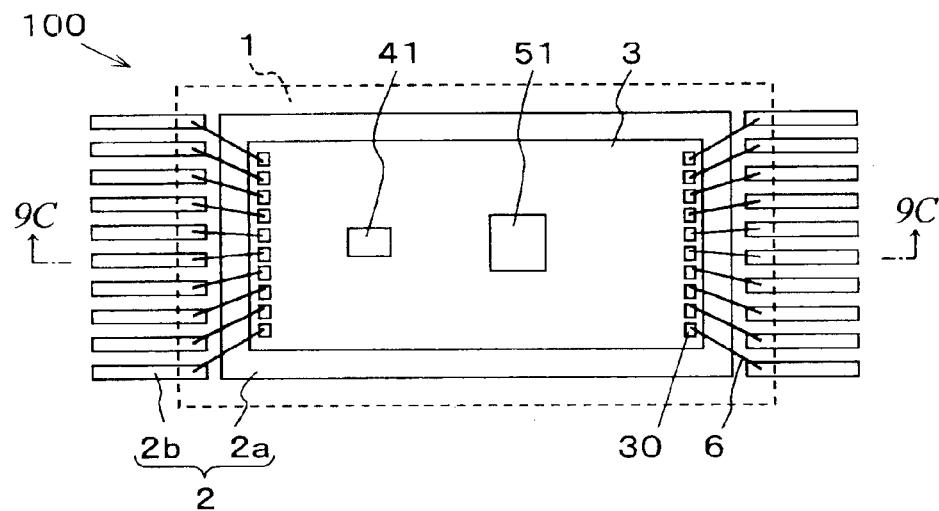
FIG. 9B is a schematic top view of a composite IC device of the related art.
Figure 9C:
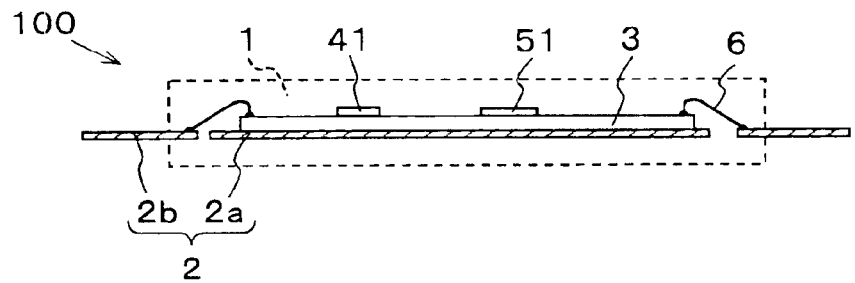
FIG. 9C is a sectional view taken along line 9C—9C of FIG. 9B.

The composite IC device 101 of the embodiment includes a hollow member 20 in the seat member 2a of the lead frame 2. In this point, the composite IC device 100 of the related art shown in FIGS. 9B, 9C is different from the composite IC device 101 of this embodiment.

There is a large difference in a coefficient of heat conductivity between an insulating material constituting a substrate and a metal material constituting a lead frame. For instance, a coefficient of heat conductivity of the alumina substrate 3 is 0.03 W/mm·K, while that of the seat member 2a formed of copper is 0.403 W/mm·K. A coefficient of heat conductivity of the mold resin 1 is even smaller, 0.001 W/mm·K. This means that the coefficient of the heat conductivity of the seat member 2a is more than ten times as large as that of the alumina substrate 3. This indicates that, in the composite IC device 100 of the related art, heat generated from the heat element 41 is conducted mostly through the seat member 2a to the temperature-restricted element 51.

By contrast, in this embodiment, the seat member 2a has the hollow member 20. The hollow member 20 is formed in a portion of the seat member 2a, the portion of the seat member 2a which is located not only right under a bottom of the heat element 41, but also under a region surrounding the bottom of the heat element 41. This enables the hollow member 20 to restrict heat conduction from the heat element 41 to a peripheral region and to the temperature-restricted element 51. The temperature-restricted element 51 is thereby inhibited from being heated, with remaining under permissible temperature. This results in eliminating necessity of restriction of entire applied electric power, and acquiring sufficient total permissible electric current or power in the composite IC device 101 of this embodiment.

Furthermore, heat problem between the heater element 41 and the temperature-restricted element 51 can be solved without enlargement of the alumina substrate 3 and addition of any heat dissipating component. This leads to realizing a compact and low-cost composite IC device 101.

Here, the hollow member 20 is under the region surrounding the bottom of the heater element 41 to restrict the heat conduction from the heater element 41. This leads to increasing temperature of the heater element 41 in comparison to a case where no hollow member is provided in the seat member 2a. A permissible temperature of the heater element 41 can be thereby designed at a higher temperature. This embodiment is suitable for a composite IC device having a heater element 41 with a sufficiently high permissible temperature.

A manufacturing method of the above-mentioned composite IC device 101 will be explained with reference to FIGS. 2A to 2C, and 3A to 3C.

Figure 2A:
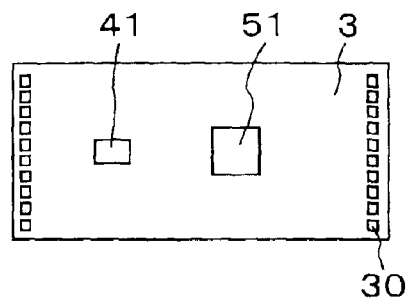
FIGS. 2A to 2C are top views showing manufacturing method of the composite IC device.
Figure 2B:
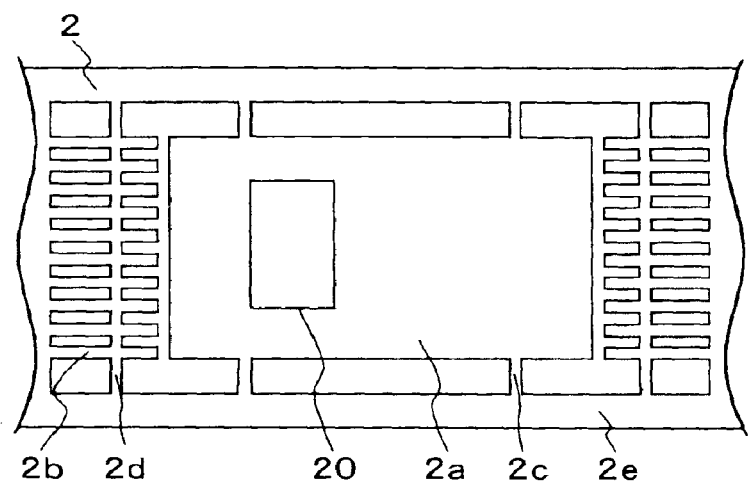

An alumina substrate 3 shown in FIG. 2A includes wiring patterns such as pads 30, a resistor 41, and a power transistor 51 on it. A lead frame 2 is, through cutting of press work, formed of a seat member 2a, lead pins 2b, seat holding members 2c, lead-pin holding members 2d, a frame 2e, and a hollow member 20 as shown in FIG. 2B.

Figure 2C:
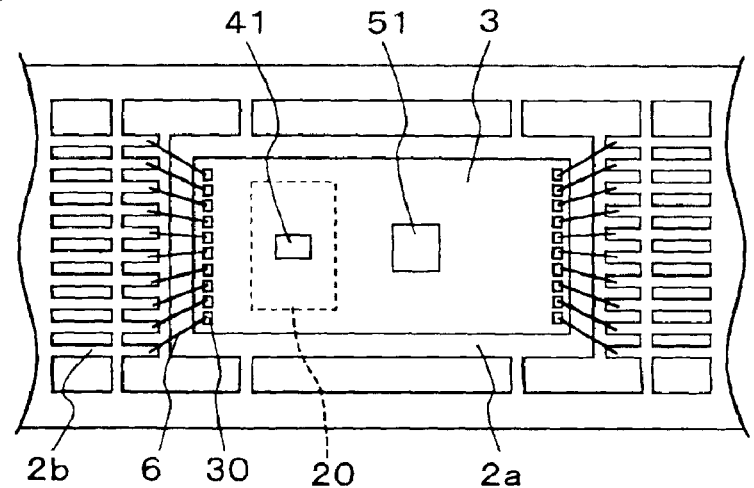

The alumina substrate 3 is attached with an adhesive over the seat member 2a of the lead frame 2. The pads 30 formed on the substrate 3 and the lead pins 2b are connected with bonding wires 6 as shown in FIG. 2C.

Figure 3A:
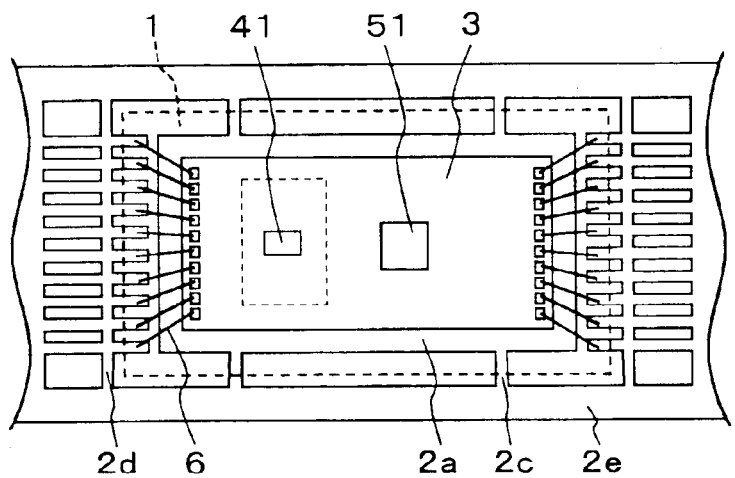
FIGS. 3A to 3C are top views showing manufacturing method of the composite IC device.

An entire portion, encircled in a dashed line in FIG. 3A, including the seat member 2a, the substrate 3, and wires 6 are molded and sealed with a mold resin 1.

Figure 3B:
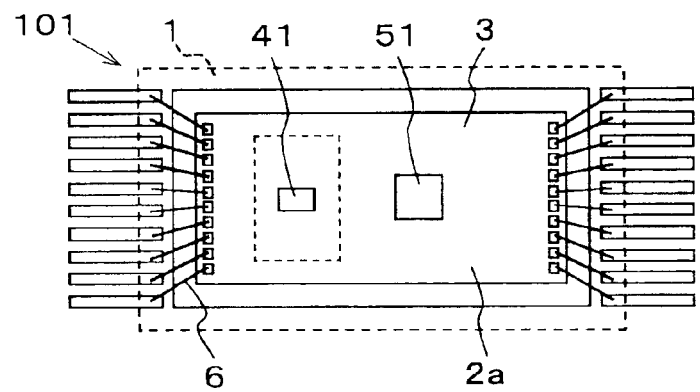
Figure 3C:
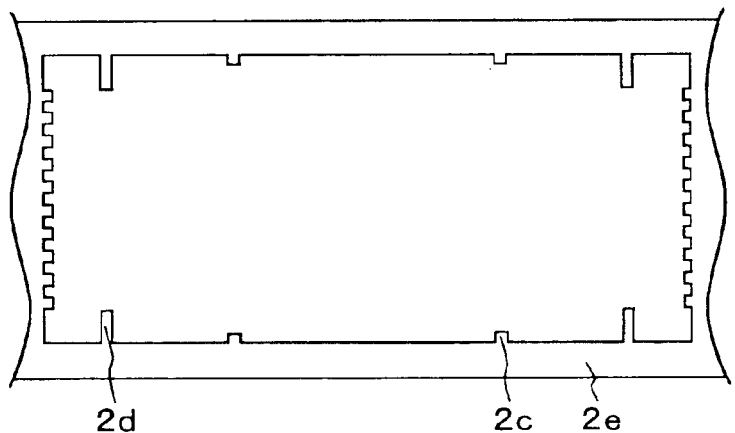

Finally, as shown in FIG. 3B, cutting the lead pins 2b, the lead-pin holding members 2d, and the seat holding members 2c leads to completion of the composite IC device 101. FIG. 3C shows a residue of the frame 2e posterior to completion of cutting. In detail, although a portion of the departed seat holing members 2c remains in connection with the seat member 2a, the portion is not shown in FIG. 3B for FIG. 3B to be simplified.

The composite IC device 101 of this embodiment additionally includes the hollow member 20 in the seat member 2a in comparison to the composite IC device 100 of the related art. This hollow member 20 is formed by changing a press die of the press work shown in FIG. 2B. The manufacturing method shown in FIGS. 2A to 2C, 3A to 3C is the same as that of the related art composite IC device 100. Furthermore, a manufacturing cost remains the same as that of the related art.

(Second Embodiment)

Figure 4:
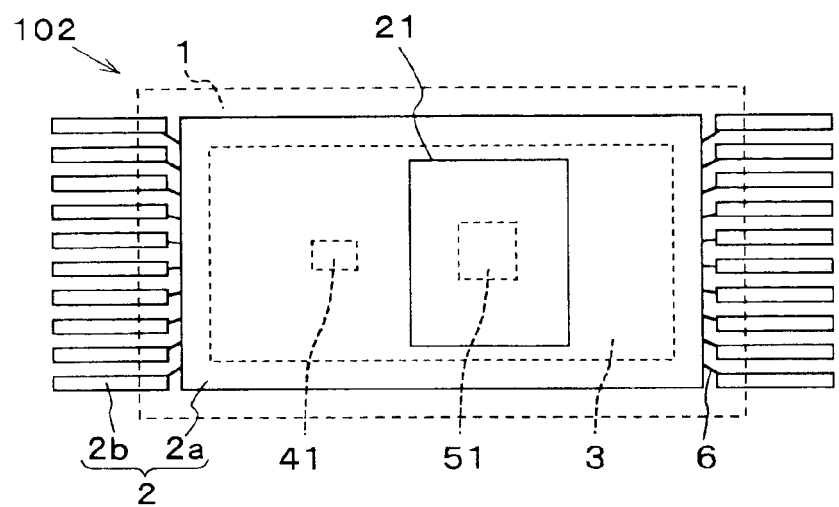
FIG. 4 is a schematic bottom view of a composite IC device according to a second embodiment of the present invention.

In the first embodiment, the composite IC device 101 has the seat member 2a including the hollow member 20 formed in the portion that is located not only right under the bottom of the heat element 41, but also under the region surrounding the bottom of the heat element 41. In a second embodiment, a composite IC device 102 has a seat member 2*a* differently including a hollow member. As shown in FIG. 4, a hollow member 21 is formed in a portion that is located under a bottom of a temperature-restricted element 51 and a region surrounding the bottom of the temperature-restricted element 51.

In the first embodiment, the hollow member 20 is under the region that surrounds the bottom of the heater element 41 to restrict heat conduction from the heat element 41 to a peripheral region. However, in the second embodiment, the hollow member 21 is under the region that surrounds the temperature-restricted element 51 to restrict heat conduction flowing into the temperature-restricted element 51 from a peripheral region. This also results in restricting conduction of the heat generated from the heater element 41 to be conducted to the temperature-restricted element 51.

The first embodiment is suitable for a composite IC device having a heater element 41 with a sufficiently high permissible temperature. By contrast, in the second embodiment, the presence of the seat member 2*a* right under the heater element 41 can dissipate the heat from itself to the peripheral region. This means that the second embodiment is suitable for a composite IC device having a heater element 41 with less margin with respect to temperature increase. Furthermore, forming the hollow member 21 under the region surrounding the bottom of the temperature-restricted element 51 restricts heat conduction to a peripheral region. This means that the second embodiment is suitable for a composite IC device having a temperature-restricted element 51 that generates less heat.

(Third Embodiment)

Figure 5:
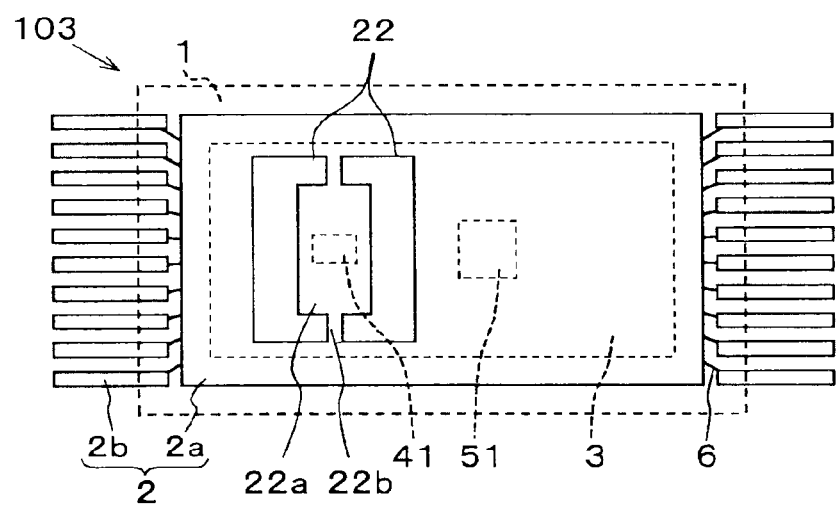
FIG. 5 is a schematic bottom view of a composite IC device according to a third embodiment of the present invention.

In the first embodiment, the composite IC device 101 has the seat member 2*a* including the hollow member 20 formed in the portion that is located not only right under the bottom of the heat element 41, but also under the region surrounding the bottom of the heat element 41. In a third embodiment, a composite IC device 103 has a seat member 2*a* differently including a hollow member. As shown in FIG. 5, a hollow member 22 is formed in a portion of the seat member 2*a* that is located only under a region surrounding the bottom of the heater element 41, without being formed right under the bottom of the heater element 41. Namely, a land seat 22*a* as a portion of the seat member 2*a* is present right under the bottom of the heater element 41. The land seat 22*a* is connected with a main body of the seat member 2*a* through land holding members 22*b*, while the hollow member 22 is provided in the seat member 2*a* to be under the region that surrounds the bottom of the heater element 41.

Similarly with the first embodiment, the hollow member 22 restricts heat conduction from the heat element 41 to a peripheral region. In addition, the presence of the land seat 22*a* can enable controlling a direction and an amount of heat conduction. Heat generated from the heater element 41 is conducted to the land seat 22*a* and then to the peripheral region with passing through the land holding members 22*b*. Designing of layout and width of the land holding members 22*b* can lead to controlling the direction and amount of heat conduction from the heater element 41. Designing proper heat load balance can be thereby possible based on permissible temperatures and locations of the heater element 41 and temperature-restricted element 51 on the substrate 3.

Furthermore, the hollow member 22 can be formed in a portion of the seat member 2*a* that is located under a region surrounding the bottom of the temperature-restricted element 51. Furthermore, the hollow member 22 can be formed in a portion of the seat member 2*a* that is located under a region surrounding not only the bottom of either heater element 41 or temperature-restricted element 51 but also an intermediate area between the bottom of the heater element 41 and the bottom of the temperature-restricted element 51.

(Fourth Embodiment)

Figure 6A:
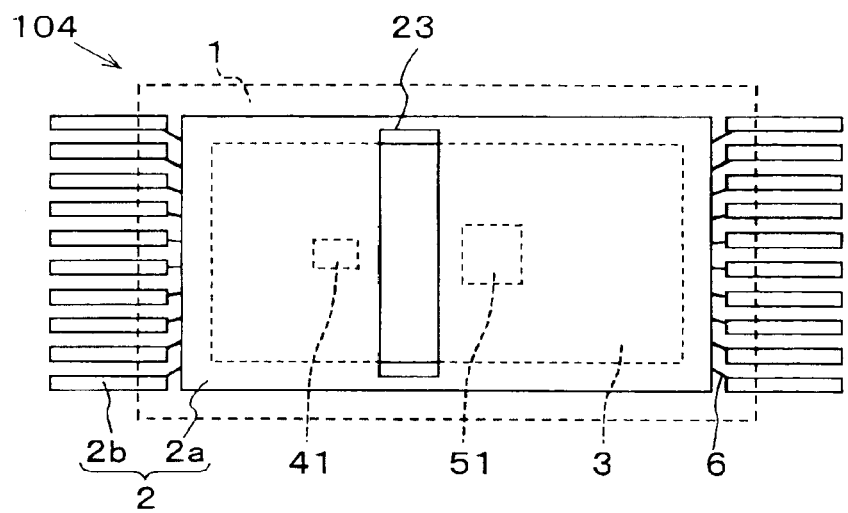
FIGS. 6A to 6B are schematic bottom views of composite IC devices according to a fourth embodiment of the present invention.

In a fourth embodiment, a composite IC device 104 has a seat member 2*a* including a hollow member 23 formed under a portion within an intermediate area between a heater element 41 and a temperature-restricted element 51 as shown in FIG. 6A.

Forming this hollow member 23 can also restrict heat conduction from the heat element 41 to the temperature-restricted element 51.

Figure 6B:
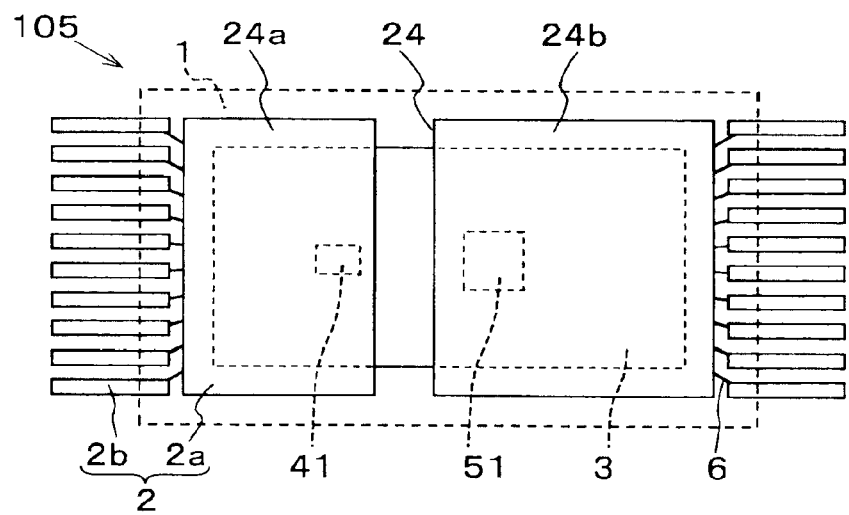

As shown in FIG. 6B, a seat member 2*a* of a composite IC device 105 can be formed of a heating land 24*a* and a temperature-restricted land 24*b*, both of which are thoroughly separated with the hollow member 24. This structure can restrict heat conduction from the heat element 41 to the temperature-restricted element 51, more effectively than the structure shown in FIG. 6A. Here, the heating land 24*a* and the temperature-restricted land 24*b* are thoroughly separated with the hollow member 24. However, during the manufacturing in this embodiment, a substrate 3 can be attached to a lead frame 2 similarly during the manufacturing of the preceding embodiments, as shown in FIG. 2C.

(Fifth Embodiment)

In the preceding embodiments, the composite IC devices have the hollow members that are formed through cutting of the press work. In a fifth embodiment, a composite IC device 106 has a hollow member 25 that is formed as a concave portion within a seat member 2*a* with press work, as shown in FIGS. 7A, 7B that correspond to FIG. 1C of the first embodiment.

Figure 7A:
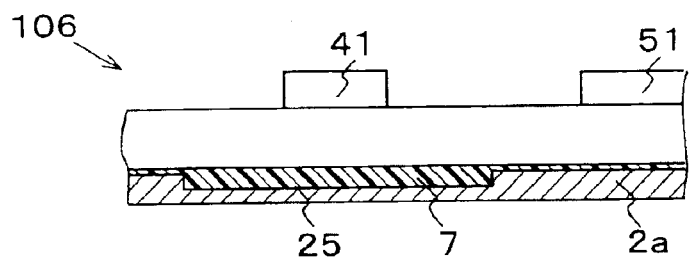
FIGS. 7A to 7B are schematic sectional views of composite IC devices according to a fifth embodiment of the present invention.
Figure 7B:
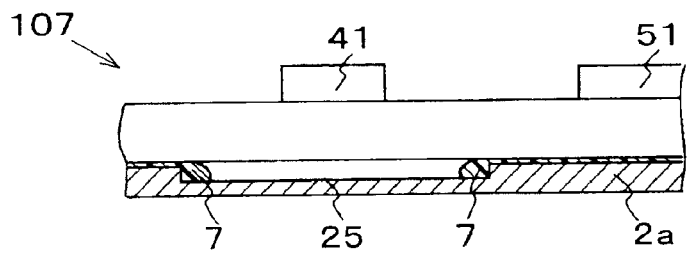

FIG. 7A shows a structure where the concave portion of the hollow member 25 is fully filled with an adhesive 7, while FIG. 7B shows a structure where the concave portion remains without being filled with the adhesive 7.

The hollow member 25 is filled with the adhesive 7, while the hollow member 20 of the first embodiment is molded and filled with the mold resin 1 having a low coefficient of heat conductivity. Here, the coefficient of heat conductivity of the adhesive 7 is desirably less than 0.001 W/mm·K. Adjustment of a depth of the concave portion can lead to controlling heat conduction from the heater element 41 to the temperature-restricted element 51. The hollow member 25 can be filled with no adhesive 7 as shown in FIG. 7B as needed.

The concave portion of the hollow member 25 can be formed using the same press work for the lead frame 2 shown in FIG. 2B, only through partially changing a press die of the press work, simultaneously with cutting out other portions. This enables no increase in the manufacturing cost. In addition, a residue of an adhesive 7 can be stored in the concave portion of the hollow member 25 when the substrate 3 is attached to the seat member 2*a*. This makes it easy to control the manufacturing.

(Sixth Embodiment)

In the preceding embodiments, a seat member constituting a lead frame and other constituting members such as a lead pin have the same thickness, and all of a substrate including elements and a seat member is entirely molded with a mold resin to form a composite IC device. In a sixth embodiment, a seat member is thicker than any other constituting members of the lead frame. In addition, a substrate and a seat member are molded with a mold resin, with a bottom surface of the seat member being externally exposed without the mold resin. Here, the bottom surface is opposite to a top surface where the substrate is attached.

Figure 8:
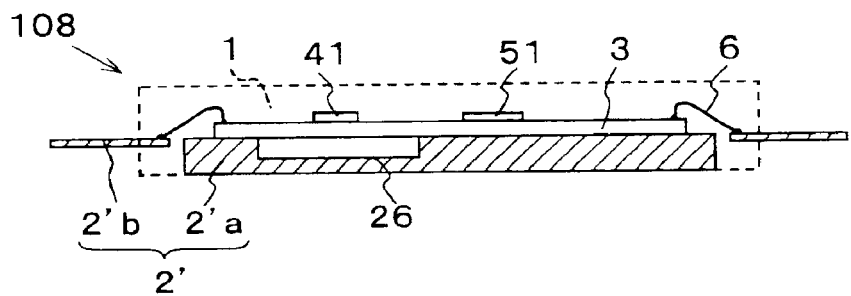
FIG. 8 is a schematic sectional view of a composite IC device according to a sixth embodiment of the present invention.

In detail, as shown in FIG. 8, in a composite IC device 108, a seat member 2'a of a lead frame 2' is thicker than lead pins 2'b. A bottom surface of the seat member 2'a that is opposite to a top surface where the substrate 3 is attached is exposed without a mold resin 1. Thick forming of the seat member 2'a enables using the seat member 2'a as a heatsink, which results in restricting increase of temperature of a temperature-restricted element 51 or externally dissipating heat generated from a heater element 41.

The hollow member 26 of this embodiment shown in FIG. 8 is formed as a concave portion. However, the hollow member 26 can be formed as a cut portion thoroughly penetrating the seat member 2'a. Although the hollow member 26 is formed as being under the bottom of the heater element 41, it can be formed as being under the bottom of the temperature-restricted element 51. Likewise in the preceding embodiments, the presence of the hollow member 26 enables controlling heat conduction from the heater element 41 to the temperature-restricted element 51.

The lead frame 2' having different thicknesses between the seat member 2'a and the lead pin 2'b is formed using the same press work shown in FIG. 2B, only by changing a press die of the press work.

Since the thick seat member 2'a of the lead frame 2' can be used as the heatsink, it is suitable for a composite IC device having a heater element 41 generating a large heat amount or a temperature-restricted element 51 having severe temperature restriction.

(Modification)

In the first to sixth embodiments, resistors are explained as instances of heater elements. However, an inductance can be also categorized as a heater element. Although the power transistors are explained as instances of temperature-restricted elements, they are also categorized as a heater element. A heater element in the present invention includes any element that thermally affects other surrounding elements due to generation of a large heat amount.

In the first to sixth embodiments, power transistors are explained as instances of temperature-restricted elements. Operating temperature of the power transistor is increased due to self-heating, and has little margin with a permissible temperature. However, a temperature-restricted element is not limited to the power transistor. A memory IC or logic IC can be categorized as a temperature-restricted element. A temperature-restricted element in the present invention includes any element that is heated by heat conduction from a peripheral region to be restricted in its operation.

In the preceding embodiments, the aluminum substrates are explained as instances of substrates. However, other ceramic substrate or a mold resin substrate such as a glass epoxy substrate can be used as a substrate in the embodiments. The present invention is suitable for any composite IC device where a heater element and a temperature-restricted element are mounted on a substrate that has a lower coefficient of heat conductivity than a metal material of a lead frame.

It will be obvious to those skilled in the art that various changes may be made in the above-described embodiments of the present invention. However, the scope of the present invention should be determined by the following claims.

What is claimed is:

1. A composite integrated circuit device comprising:
   a lead frame;
   a substrate whose bottom surface is attached with an adhesive over a top surface of a seat member of the lead frame;
   a heater element that generates heat while running and is mounted on a first area of the top surface of the substrate; and
   a temperature-restricted element that has restriction in operating temperature and is mounted on a second area of the top surface of the substrate,
   wherein the lead frame and the substrate are molded with a mold resin,
   wherein the seat member of the lead frame includes a hollow member that corresponds to a given area of the top surface of the substrate,
   wherein the given area includes at least a portion of an intermediate area that is located between the first area and the second area while the given area excludes the second area, and
   wherein the hollow area is formed as a cut portion penetrating the seat member of the lead frame.

2. The composite integrated circuit device according to claim 1,
   wherein the seat member of the lead frame is thicker than a lead pin that is formed from the lead frame, and
   wherein the bottom surface of the seat member is exposed without the mold resin.

3. The composite integrated circuit device according to claim 1,
   wherein the given area is formed as being surrounding the first area.

4. The composite integrated circuit device according to claim 3,
   wherein the given area includes the first area.

5. The composite integrated circuit device according to claim 3,
   wherein the given area is formed as being furthermore surrounding the intermediate area.

6. The composite integrated circuit device according to claim 1,
   wherein the given area is formed as being surrounding the second area.

7. The composite integrated circuit device according to claim 6,
   wherein the given area includes the second area.

8. The composite integrated circuit device according to claim 6,
   wherein the given area is formed as being furthermore surrounding the intermediate area.

9. The composite integrated circuit device according to claim 1,
   wherein the hollow member is formed through cutting of press work.

10. The composite integrated circuit device according to claim 1,
    wherein the hollow member is formed through cutting of press work, and
    wherein the first area and the second area are separated from each other by the hollow member.

11. The composite integrated circuit device according to claim 1,
    wherein the hollow member is formed as a concave portion through press work.

12. The composite integrated circuit device according to claim 11,
   wherein the concave portion remains as a cavity.

13. The composite integrated circuit device according to claim 11,
   wherein the concave portion is filled with one of the adhesive and the mold resin.

14. The composite integrated circuit device according to claim 11,
   wherein the concave portion is formed in the top surface of the seat member.

15. The composite integrated circuit device according to claim 1,
   wherein the given area is larger than at least one of the first area and the second area.

* * * * *